(12) United States Patent
Mani et al.

(10) Patent No.: US 9,105,569 B2
(45) Date of Patent: Aug. 11, 2015

(54) METHOD OF ETCHING MTJ USING CO PROCESS CHEMISTRIES

(75) Inventors: Krishnakumar Mani, San Jose, CA (US); Benjamin Chen, San Jose, CA (US)

(73) Assignee: III Holdings 1, LLC, Wilmington, DE (US)

( * ) Notice: Subject to any disclaimer, the term of this patent is extended or adjusted under 35 U.S.C. 154(b) by 44 days.

(21) Appl. No.: 13/214,107

(22) Filed: Aug. 19, 2011

(65) Prior Publication Data

US 2014/0256061 A1 Sep. 11, 2014

Related U.S. Application Data

(60) Provisional application No. 61/375,218, filed on Aug. 19, 2010.

(51) Int. Cl.
*H01L 43/12* (2006.01)
*H01L 27/22* (2006.01)

(52) U.S. Cl.
CPC ............ *H01L 27/222* (2013.01); *H01L 43/12* (2013.01)

(58) Field of Classification Search
CPC ............................. H01L 43/12; H01L 27/222
USPC ..................................... 438/3; 257/E43.006
See application file for complete search history.

(56) References Cited

U.S. PATENT DOCUMENTS

| | | | |
|---|---|---|---|
| 8,377,318 B2 * | 2/2013 | Yamamoto | 216/22 |
| 2004/0209476 A1 * | 10/2004 | Ying et al. | 438/706 |
| 2008/0090307 A1 * | 4/2008 | Xiao et al. | 438/3 |
| 2009/0078927 A1 * | 3/2009 | Xiao et al. | 257/9 |
| 2009/0173977 A1 * | 7/2009 | Xiao et al. | 257/295 |
| 2009/0256220 A1 * | 10/2009 | Horng et al. | 257/421 |
| 2010/0240151 A1 * | 9/2010 | Belen et al. | 438/3 |

\* cited by examiner

*Primary Examiner* — Walter H Swanson
(74) *Attorney, Agent, or Firm* — McAndrews, Held & Malloy, Ltd.

(57) ABSTRACT

A method for fabricating a magnetic film structure is provided. The method comprises forming a magnetic structure on a bottom electrode layer, the magnetic structure comprising at least one pinned bottom magnetic film layer having a fixed magnetic orientation; at least one top magnetic film layer whose magnetic orientation can be manipulated by a current; and a tunneling layer between the bottom magnetic film layer and the top magnetic film layer; forming a metallic hard mask atop the magnetic structure; patterning and etching the metallic hard mask to define exposed areas of the magnetic structure; selectively etching the exposed areas of the magnetic structure by a chemical etch process based on a CO etch chemistry to form discrete magnetic bits.

20 Claims, 7 Drawing Sheets

METHOD OF ETCHING MTJ USING CO PROCESS CHEMISTRIES

This application claims the benefit of priority to U.S. Provisional Patent Application No. 61/375,218 filed on Aug. 19, 2010, the entire specification of which is hereby incorporated by reference.

FIELD

Embodiments of the invention relate to MRAM (Magnetic Random Access Memory) semiconductor devices.

BACKGROUND

Nonvolatile solid state memory can be fabricated based on MRAM chips which have the potential to replace Flash memory and Electronically Programmable Read-Only Memory (EEPROM).

MRAM fabrication techniques include sputter etching and chemical etching. In the case of sputter etching (also known as Ion Beam Etching) a high energy ion beam is used to etch/pattern metallic/magnetic materials. The by-products created by this physical sputtering technique are involatile and are susceptible to redeposition on the side-walls of etched structures. This is undesirable.

Chemical etching, e.g. with chlorine based plasma chemistries may be operated under high density conditions to provide practical etch rates for most alloys. However, there is always a concern with corrosion caused by plasma residues that remain on feature sidewalls upon removal from the reactor.

SUMMARY

In one embodiment, a method for fabricating a magnetic film structure is disclosed. The method comprises forming a magnetic structure on a bottom electrode layer, said magnetic structure comprising at least one pinned bottom magnetic film layer having a fixed magnetic orientation; at least one top magnetic film layer whose magnetic orientation can be manipulated by a current; and a tunneling layer between the bottom magnetic film layer and the top magnetic film layer; forming a metallic hard mask atop said magnetic structure; patterning and etching said metallic hard mask to define exposed areas of the magnetic structure; selectively etching said exposed areas of said magnetic structure by a chemical etch process based on a CO etch chemistry to form discrete magnetic bits.

BRIEF DESCRIPTION OF THE DRAWINGS

The following drawings are illustrative of particular embodiments and therefore do not limit the scope of the invention, but are presented to assist in providing a proper understanding. The drawings are not to scale and are intended for use in conjunction with the explanations in the following detailed description. The present invention will hereinafter be described in conjunction with the appended drawings, wherein like reference numerals denote like elements.

DETAILED DESCRIPTION OF THE INVENTION

Figure 1:
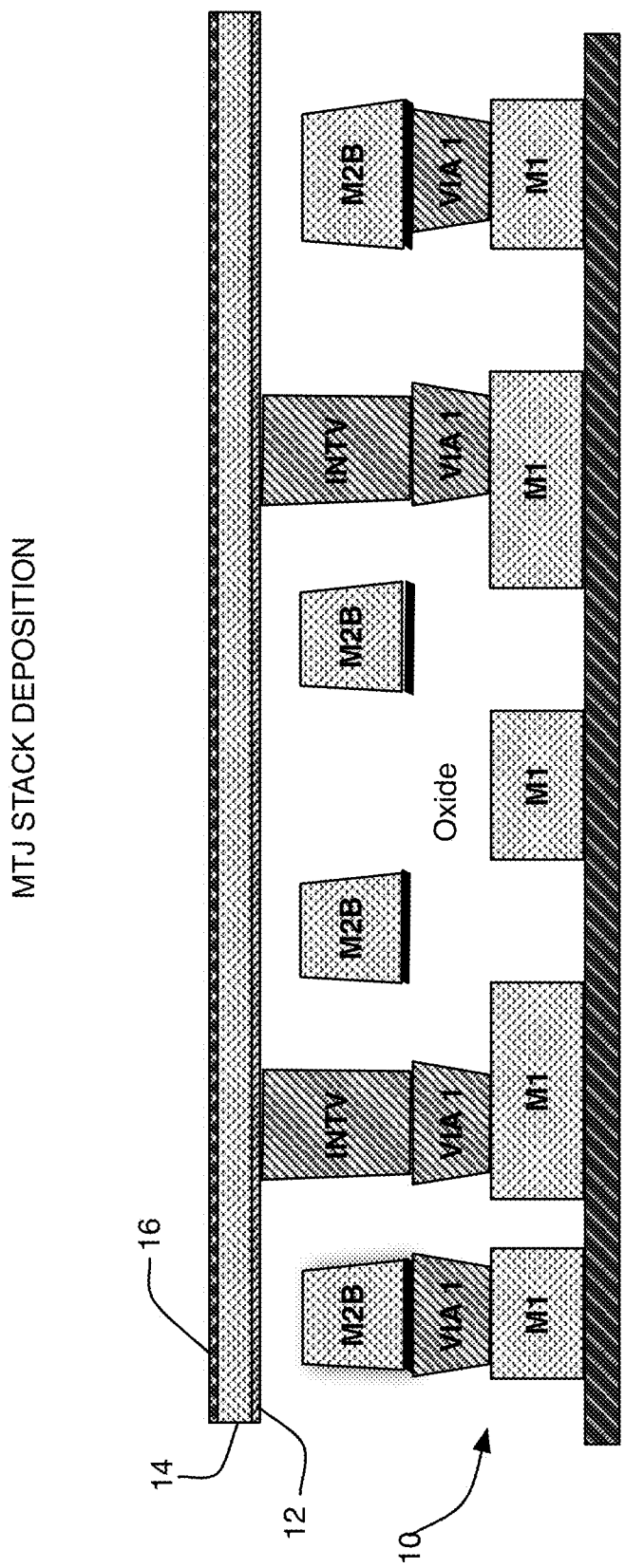
FIGS. 1-7 illustrate steps for producing a MRAM circuit, in accordance with one embodiment of the invention.

In the following description, for purposes of explanation, numerous specific details are set forth in order to provide a thorough understanding of the invention. It will be apparent, however, to one of ordinary skill in the art that the invention may be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in this specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The shortcomings of the conventional physical sputter or chlorine etch can be resolved by using a method that can etch the multi-layer materials without re-depositions on the sidewalls by using a Carbonyl reactive ion etch (RIE) process. The etched devices are also corrosion free under these carbon monoxide (CO) based gas chemistries. An electro conductive material is used as the hard mask such as titanium nitride (TiN) for etching the Magnetic-Tunneling-Junction (MTJ) and for allowing self aligned via for the following bottom electrode (BELT) etch step. Carbonyl reactive ion etch has good selectivity of TiN to MTJ.

It has been well known in the steel industry that iron will form iron carbonyl $Fe(CO)_5$ when reacted with CO at a boiling point of 103° C. Subsequently it was found that most metals will form carbonyls at elevated temperatures. On that basis NiFe can be etched reactively in a plasma reactive ion etch chamber into $Ni(CO)_4$ and $Fe(CO)_5$, where the byproducts are volatile and may be pumped away.

Embodiments of the present invention disclose a method for etching multi-layer metallic stacks in MRAM devices utilizing CO based etch chemistries to form volatile carbonyl byproducts. In one embodiment $NH_3$ is added into the CO gas mixture to prevent to certain extent the dissociation of CO into non-reactive carbon and oxygen. As a result, C to O bonding was preserved as the reactive etching species, and the formation of carbide and oxide on the surface was avoided. An alternative gas chemistry for producing carbonyl by-products effectively is methanol (CH3OH), where CO reactive species can be generated in a plasma without the need for the additional ammonia. Typical etch rates were ~300 Å·min-1 for Ni0.8Fe0.2, a factor of about three higher than purely physical Ar+ sputtering as in ion milling at similar RF power and pressure ratios. The method includes utilizing a metallic hard mask that is in-volatile to the CO/NH3 or CH3OH process chemistry such as Ta, TiN or Al2O3. The disclosed process may be operated at 100° C. to 200° C., below temperatures that could alter the magnetic properties of the MTJ. The disclosed process may be run at an inductively-coupled-plasma (ICP) reactor (may include capacitively-coupled (CCP), transformer-coupled (TCP) reactors and electron cyclotron resonance (ECR)) and run at a substrate bias power level that does cause electrical damage (ESD) to the sensitive device layers. Advantageously, the CO/NH3 or methanol chemistries do not cause corrosion upon wafer removal from the reactor since no residue is left behind on feature sidewalls.

FIGS. 1-6 illustrate embodiments of the disclosed technique for fabricating a magnetic film structure in the form of a MRAM circuit/chip. Referring to FIG. 1, a Magnetic Tunnel Junction (MTJ) deposition step is shown. The MTJ deposition step include deposition of a Bottom Electrode Layer (BELT) 12; forming a magnetic structure through deposition of a MTJ stack 14 on the Bottom Electrode Layer (BELT) 12;

and deposition of a capping layer 16. In one embodiment, the capping layer may comprise ruthenium. All of the aforementioned deposition steps are on a pre-fabricated structure 10 comprising pre-fabricated circuitry on a substrate using techniques known to one of ordinary skill in the art. The MTJ stack may comprise a fixed or pinned bottom magnetic layer; and a top free magnetic layer. The two layers may be separated by a tunneling layer. A magnetic orientation of the fixed magnetic layer is fixed, whereas a magnetic orientation of the top free magnetic layer may be changed through application of a switching field or current.

Figure 2:
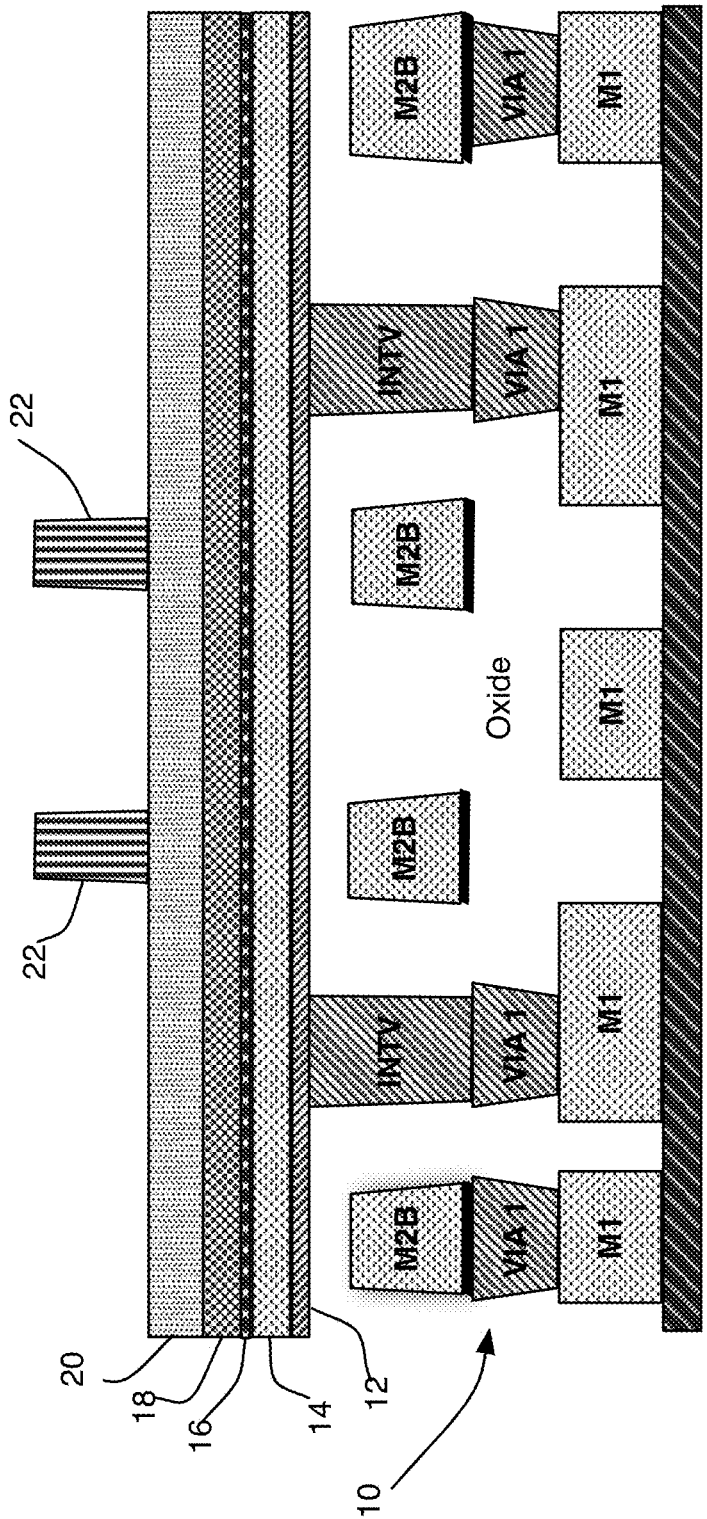

Turning now to FIG. 2, there is shown a Hard Mask (HM) deposition and MTJ lithography step. This step includes deposition of a metallic hard mask 18; deposition of a Bottom Antireflective Coating 20; and deposition and patterning (lithography) of a photoresist 22. All of using techniques known to one of ordinary skill in the art. In one embodiment, the metallic hard mask may comprise titanium. In other embodiments the metallic hard mask may be selected from the group consisting of one of titanium, tantalum, titanium nitride, silicon dioxide, aluminum, and amorphous carbon. In other embodiments, the hard mask 18 may be of any suitable material that does not form carbonyls.

Figure 3:
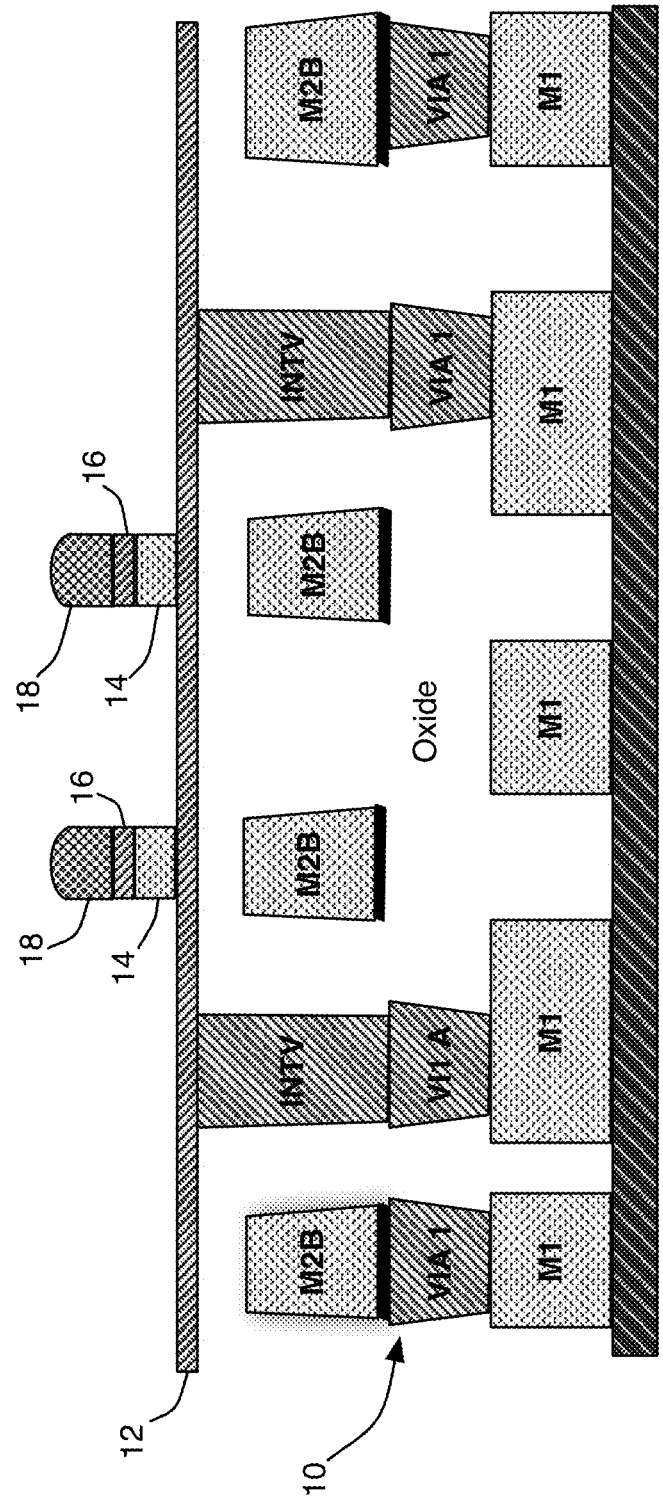

Turning now to FIG. 3, there is shown a Hard Mask Magnetic Sack Etch step. Under this step, the metallic hard mask 18 is etched followed by etching of photoresist 22. In one embodiment, a fluorine based chemistry may be used for this etching step.

Figure 4:
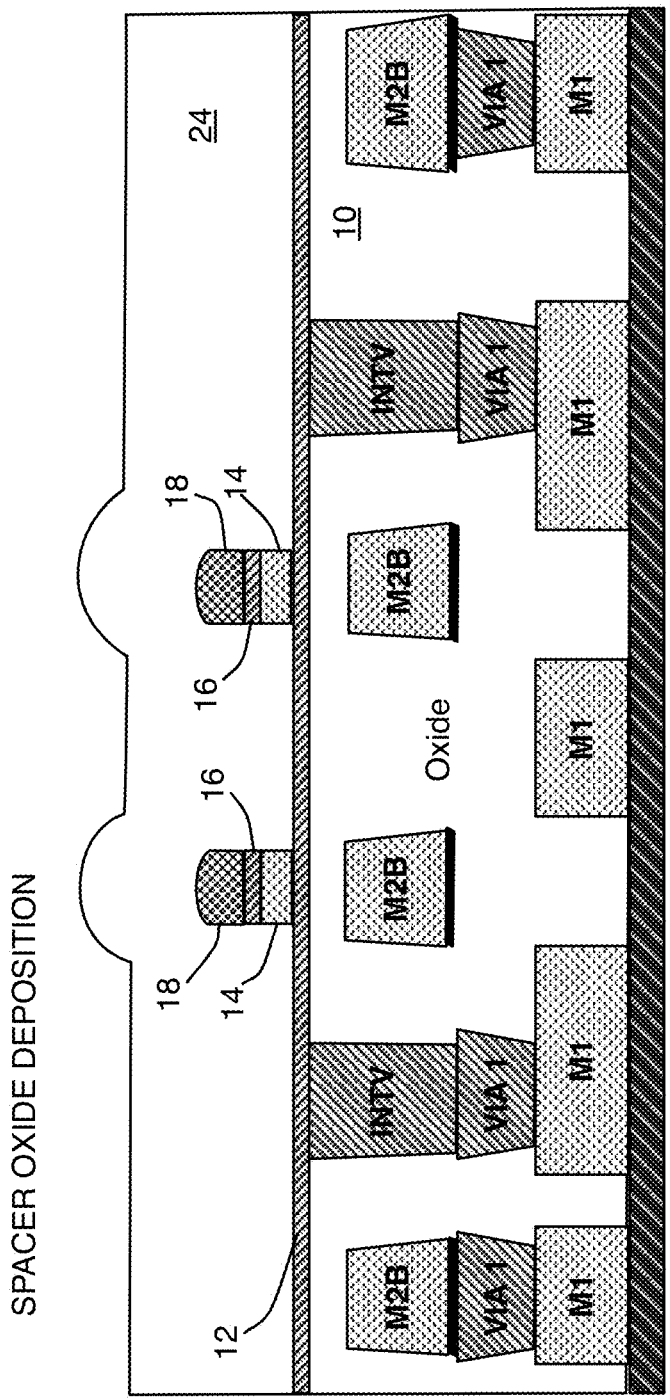

FIG. 4 illustrates deposition of an oxide spacer 24.

Figure 5:
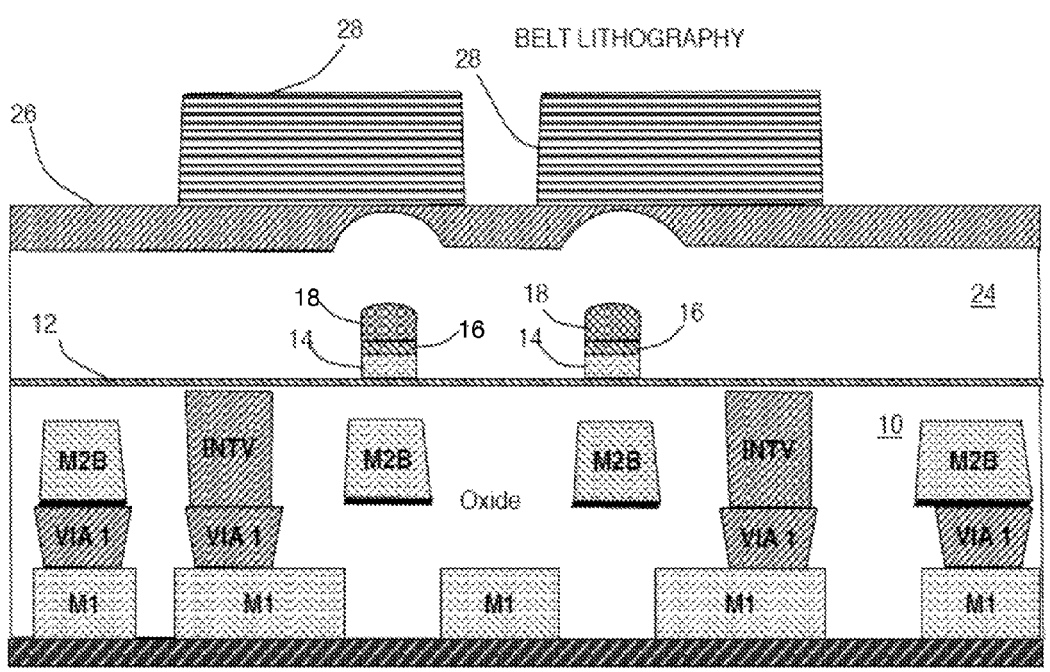

FIG. 5 illustrates a BELT lithography step. This step include deposition of BARC layer 26 and photoresist 28 followed by a lithography step to pattern the layer 28.

Figure 6:
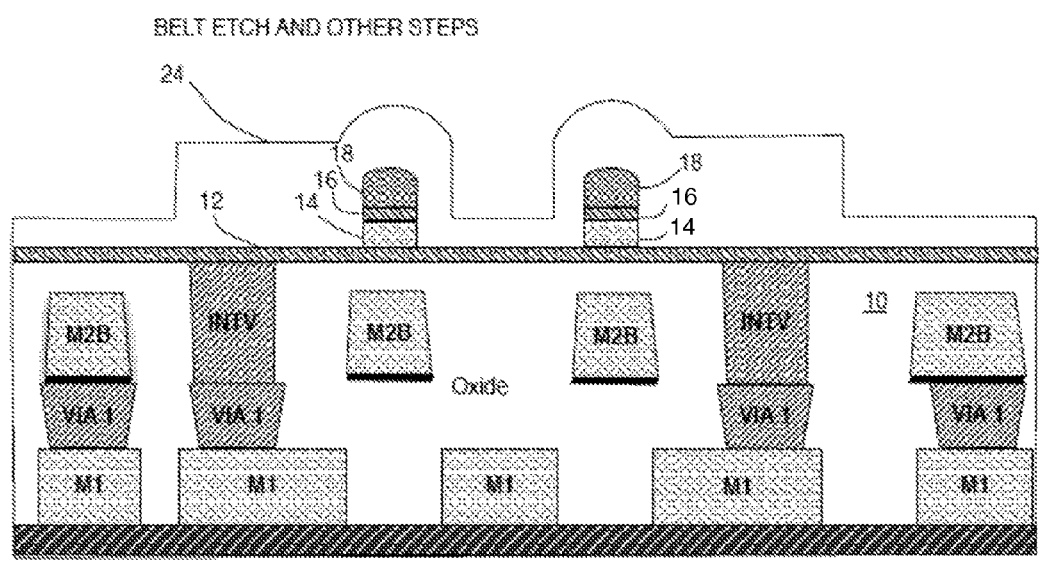

FIG. 6. illustrates a BELT etch step wherein the oxide spacer 24 has been etched.

One of ordinary skill in the art would appreciate that the above outlined processing steps may be used to fabricate a MRAM circuit/chip with a plurality of discrete magnetic bits.

The etch chemistries that may be used in the above outlined steps, in accordance with one embodiment of the invention, are provided below.

TABLE 1

| CO sccm | NH3 sccm | Press mTorr | Bias Power Watt | Source Power Watt | Temp °C. |
|---|---|---|---|---|---|
| 6 to 20 | 10 to 30 | 1 to 10 | 100 to 300 | 500 to 2000 | 100 to 200 |

CO/NH3 Etch Chemistry for Magnetic Materials

Table 2 below indicates process parameters of a CH3OH etch chemistry, in accordance with one embodiment.

TABLE 2

| CH3OH sccm | Press mTorr | Bias Power Watt | Source Power Watt | Temp °C. |
|---|---|---|---|---|
| 10 to 30 | 1 to 10 | 100 to 300 | 500 to 2000 | 100 to 200 |

CH3OH Etch Chemistry for Magnetic Materials

Table 3 below shows process parameters for deposition of the hard mask layer 18, in accordance with one embodiment.

TABLE 3

| Tool | | Thick | Dep Time | Press | Temp | Power | AR-TIW | ARH-TIW | Dep Rate | |
|---|---|---|---|---|---|---|---|---|---|---|
| Endura | Material | A | sec | mT | °C. | W | sccm | sccm | A/sec | A/min |
| Endura | Columnar Ti | 550 | 70 | 4.5 | 40 | 8000 | 80 | 15 | 7.9 | 471 |

Table 4 below shows process parameters for patterning of the MTJ stack, in accordance with one embodiment.

TABLE 4

| Tool | BARC | RESIST | Illumination | Exp Eng | FOV |
|---|---|---|---|---|---|
| ASM 193 nm Scanner | 650A AR77 | 3500A TOK | Conventional | 21 mJ | −0.1 |

Table 5 below shows process parameters for etching the hard mask, in accordance with one embodiment.

TABLE 5

| Tool | | Thick | | Etch Time | Press | Temp | Pwr kHz | Pwr MHz | Cl2 | BCl3 | N2 | Ar | Etch Rate | |
|---|---|---|---|---|---|---|---|---|---|---|---|---|---|---|
| LAM9600 | Material | A | ME/OE | sec | mTor | °C. | Watt | Watt | cc | cc | cc | cc | A/sec | A/min |
| LAM9600 | Ti | 500 | ME | 30 | 8.0 | 65 | 100 | 500 | 20 | 10 | 5 | 5 | 41.7 | 2500 |

Table 6 below shows process parameters for etching the MTJ stack, in accordance with one embodiment.

TABLE 6

| Tool | Material | Thick A | Etch Time sec | Press mTor | Temp °C. | Pwr kHz Watt | Pwr MHz Watt | CO cc | NH3 cc | Etch Rate A/sec | A/min |
|---|---|---|---|---|---|---|---|---|---|---|---|
| Tegal3-PM2 | | | ME/OE | | | | | | | | |
| Tegal3-PM2 | MTJ | 450 | ME 250 | 3.5 | 170 | 250 | 1000 | 12 | 20 | 1.8 | 108 |
| Tegal3-PM2 | MTJ | | OE 250 | 10 | 170 | 75 | 500 | 12 | 20 | | |

In the Table 6 ME denoted a main etch step whereas OE denotes an over etch step. In one embodiment, the end points for these etch steps is based on spectral analysis of the plasma within the etching chamber. In particular, spectral signature of the plasma is monitored during the ME step which is ended when the etching is stopped when a drop in Signal Intensity at 420 nm is observed.

Table 7 below shows process parameters for deposition of the spacer oxide, in accordance with one embodiment.

TABLE 7

| Tool | Material | Thick A | Dep Time sec | Press Torr | Temp °C. | HF kW | LF kW | O2 ml/min | TEOS ml/min | Dep Rate A/sec | A/min |
|---|---|---|---|---|---|---|---|---|---|---|---|
| Novellus 3 | | | | | | | | | | | |
| Novellus 3 | TEOS | 2500 | 18 | 1.6 | 350 | 0.40 | 0.50 | 7 | 1.5 | 28.4 | 1704 |

Table 8 below shows process parameters for the BELT lithography step, in accordance with one embodiment.

TABLE 8

| Tool | BARC | RESIST | Illumination | Exp Enc | FOV |
|---|---|---|---|---|---|
| ASM248 | 800A AR | 7000A UV6 | Conventional | 13 mJ | −0.1 |

Table 9 below shows process parameters for the BELT etch and subsequent steps, in accordance with one embodiment.

TABLE 9

| Tegal3-PM-ICP | Material | Etched Thick A | Etch Time sec | Press mTor | Temp °C. | Pwr kHz Watt | Pwr MHz Watt | CF4 cc | Ar cc | Etch Rate A/sec | A/min |
|---|---|---|---|---|---|---|---|---|---|---|---|
| Tool | | | | | | | | | | | |
| Tegal3-PM1-ICP Semitool | Oxide | 2500 | 370 | 3.5 | 30 | 26 | 400 | 15 | 15 | 6.76 | 405 |
| Tegal3-PM1-ICP | Oxide + BELT | 1000 | 150 | 10 | 30 | 26 | 400 | 20 | 30 | 5.00 | 300 |

Figure 7:
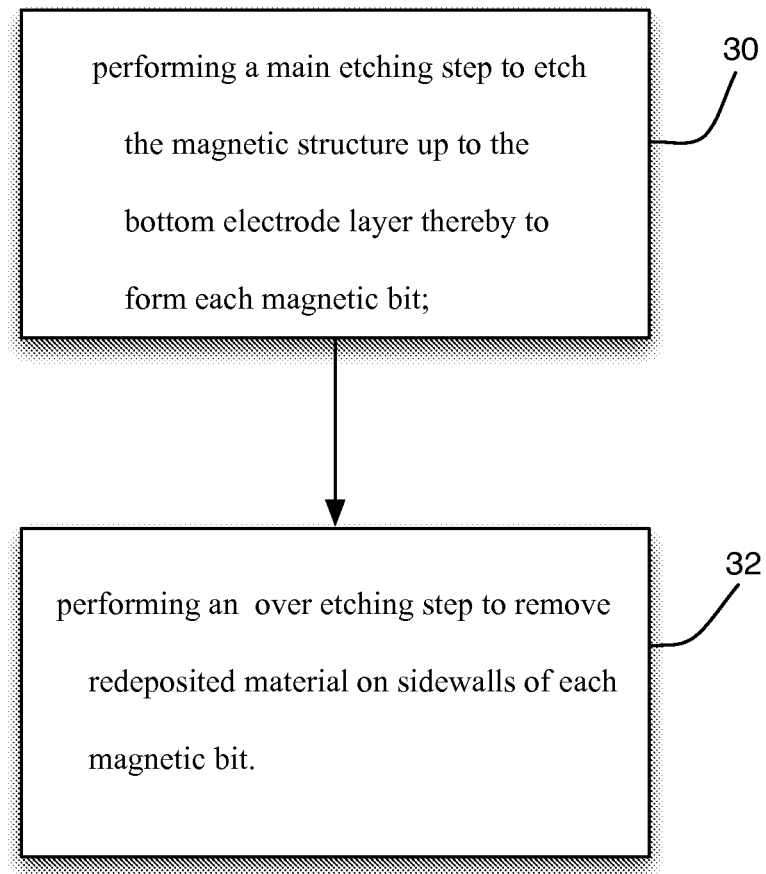

In one embodiment, a main etching step is performed to etch the magnetic structure up to the bottom electrode layer thereby to form each magnetic bit. This step is indicated by block 30 in FIG. 7 of the drawings. Continuing with FIG. 7, at block 32, an over etching step is performed to remove re-deposited material on sidewalls of each magnetic bit.

Although the present embodiments have been described with reference to specific example embodiments, it will be evident that various modifications and changes may be made to these embodiments without departing from the broader spirit and scope of the various embodiments.

The invention claimed is:

1. A method for fabricating a magnetic film structure, the method comprising:
   forming a magnetic structure on a bottom electrode layer, wherein the magnetic structure includes:
   at least one pinned bottom magnetic film layer having a fixed magnetic orientation;
   at least one top magnetic film layer having a magnetic orientation that can be manipulated by a current; and
   a tunneling layer between the at least one pinned bottom magnetic film layer and the at least one top magnetic film layer;
   forming a metallic hard mask above the magnetic structure;
   etching, by inductively-coupled plasma etching, the metallic hard mask, but not the magnetic structure, using a first chemistry;
   starting etching of the magnetic structure using a second chemistry to form at least one magnetic bit, wherein the second chemistry is different from the first chemistry;
   monitoring a signal of a spectral signature of a plasma at a predetermined wavelength while etching the magnetic structure;
   stopping etching of the magnetic structure when a drop in the signal is observed; and
   removing redeposited material from at least one sidewall of the at least one magnetic bit by over-etching the at least one pinned bottom magnetic film layer, the at least one top magnetic film layer, and the tunneling layer, wherein the over-etching uses inductively-coupled plasma etching.

2. The method of claim 1, wherein the metallic hard mask comprises at least one of titanium, tantalum, titanium nitride, silicon dioxide, aluminum, or amorphous carbon.

3. The method of claim 2, wherein the metallic hard mask comprises titanium nitride.

4. The method of claim 2, wherein the metallic hard mask comprises titanium.

5. The method of claim 1, wherein the second chemistry comprises carbon monoxide.

6. The method of claim 5, wherein the second chemistry comprises a mixture of carbon monoxide and ammonia.

7. The method of claim 1, wherein the second chemistry comprises methanol.

8. The method of claim 1, wherein the first chemistry comprises a fluorine-based chemistry.

9. The method of claim 8, wherein the second chemistry comprises carbon monoxide.

10. The method of claim 9, wherein the second chemistry comprises a mixture of carbon monoxide and ammonia.

11. The method of claim 8, wherein the second chemistry comprises methanol.

12. The method of claim 1, further comprising forming a capping layer above the magnetic structure, wherein the metallic hard mask is formed above the capping layer.

13. The method of claim 12, wherein the capping layer comprises ruthenium.

14. The method of claim 1, further comprising forming a bottom antireflective coating above the metallic hard mask.

15. The method of claim 1, further comprising forming and etching an oxide spacer above the magnetic bit.

16. The method of claim 1, wherein said starting etching of the magnetic structure is performed at a higher power than said removing redeposited material.

17. The method of claim 1, wherein said starting etching of the magnetic structure is performed at a higher frequency than said removing redeposited material.

18. The method of claim 1, wherein said starting etching of the magnetic structure is performed at a lower pressure than said removing redeposited material.

19. The method of claim 1, wherein:
said starting etching of the magnetic structure is performed at a higher power than said removing redeposited material;
said starting etching of the magnetic structure is performed at a higher frequency than said removing redeposited material; and
said starting etching of the magnetic structure is performed at a lower pressure than said removing redeposited material.

20. The method of claim 1, wherein said removing redeposited material is performed using the second chemistry.

* * * * *